(12) United States Patent
Beaman et al.

(10) Patent No.: US 6,528,984 B2
(45) Date of Patent: *Mar. 4, 2003

(54) INTEGRATED COMPLIANT PROBE FOR WAFER LEVEL TEST AND BURN-IN

(75) Inventors: Brian Samuel Beaman, Apex, NC (US); Keith Edward Fogel, Mohegan Lake, NY (US); Paul Alfred Lauro, Nanuet, NY (US); Da-Yuan Shih, Poughkeepsie, NY (US)

(73) Assignee: IBM Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/254,768

(22) PCT Filed: Sep. 12, 1997

(86) PCT No.: PCT/US97/16265

§ 371 (c)(1),
(2), (4) Date: Mar. 11, 1999

(87) PCT Pub. No.: WO98/11446

PCT Pub. Date: Mar. 19, 1998

(65) Prior Publication Data

US 2002/0130676 A1 Sep. 19, 2002

Related U.S. Application Data

(60) Provisional application No. 60/026,112, filed on Sep. 13, 1996.

(51) Int. Cl.⁷ .............................................. G01R 1/073
(52) U.S. Cl. ...................... 324/158.1; 324/754; 439/66; 439/91; 439/71
(58) Field of Search ................................. 324/754, 755, 324/158.1; 439/66, 91, 591.65, 59–65, 86, 74, 71

(56) References Cited

U.S. PATENT DOCUMENTS

| 5,531,022 A | * | 7/1996 | Beaman et al. ............... 439/66 |
| 5,785,538 A | * | 7/1998 | Beaman et al. ............... 439/91 |
| 5,793,330 A | * | 8/1998 | Distefano et al. ............. 439/66 |
| 5,810,607 A | * | 9/1998 | Shih et al. .................... 439/66 |
| 6,062,879 A | * | 5/2000 | Beaman et al. ............... 439/91 |
| 6,064,213 A | * | 5/2000 | Khandros et al. ........... 324/754 |

FOREIGN PATENT DOCUMENTS

| JP | 58-165056 | 9/1983 |
| JP | 4-51662 | 4/1992 |
| JP | 4-240570 | 8/1992 |
| JP | 5-55319 | 3/1993 |
| JP | 06082481 A | 3/1994 |
| JP | 06204399 A | 7/1994 |
| JP | 06300783 A | 10/1994 |
| JP | 07301642 A | 11/1995 |
| JP | 07321490 | 12/1995 |
| JP | 09061461 A | 3/1997 |
| JP | 09229963 A | 9/1997 |
| JP | 09281145 A | 10/1997 |
| JP | 09304472 A | 11/1997 |
| JP | 10019931 A | 1/1998 |
| WO | WO 95/14314 | 5/1995 |
| WO | WO 96/14659 | 5/1996 |
| WO | WO 96/14660 | 5/1996 |
| WO | WO 96/17378 | 6/1996 |

* cited by examiner

Primary Examiner—Michael Sherry
Assistant Examiner—Jimmy Nguyen

(57) ABSTRACT

The present invention is directed to a structure comprising a substrate having a surface; a plurality of elongated electrical conductors extending away from the surface; each of said elongated electrical conductors having a first end affixed to the surface and a second end projecting away from the surface; there being a plurality of second ends; and a means for maintaining the plurality of second ends in substantially fixed positions with respect to each other. The structure is useful as a probe for testing and burning in integrated circuit chips at the wafer level.

12 Claims, 16 Drawing Sheets

INTEGRATED COMPLIANT PROBE FOR WAFER LEVEL TEST AND BURN-IN

This application claims priority from Provisional Application U.S. Ser. No. 60/026,112 which was filed on Sep. 13, 1996.

CROSS REFERENCE TO RELATED APPLICATION

The teaching of U.S. application Ser. No. 09/254,769 filed on the same day herewith entitled, "WAFER SCALE HIGH DENSITY PROBE ASSEMBLY, APPARATUS FOR USE THEREOF AND METHODS OF FABRICATION THEREOF" to Brian S. Beaman et al. and the teaching of U.S. application Ser. No. 09/254,798 filed on the same day herewith entitled, "PROBE STRUCTURE HAVING A PLURALITY OF DISCRETE INSULATED PROBE TIPS PROJECTING FROM A SUPPORT SURFACE, APPARATUS FOR USE THEREOF AND METHODS OF FABRICATION THEREOF" to Brian S. Beaman et al. is incorporated herein by reference.

FIELD OF THE INVENTION

The present invention is directed to structures, methods of fabrication and apparatus for use thereof for testing of electronic devices, such as integrated circuit devices and other electronic components and particularly to testing of integrated circuit devices with rigid interconnection pads and multi-chip module packages with high density interconnection pads.

BACKGROUND OF THE INVENTION

Integrated circuit (IC) devices and other electronic components are normally tested to verify the electrical function of the device and certain devices require high temperature burn-in testing to accelerate early life failures of these devices. Wafer probing is typically done on a single chip site at temperatures ranging from 25 C–125 C while burn-in is typically done on diced and packaged chips at temperatures ranging from 80 C to 150 C. Wafer probing and IC chip burn-in at elevated temperatures of up to 200 C has several advantages and is becoming increasingly important in the semiconductor industry. Simultaneous testing of multiple chips on a single wafer has obvious advantages for reducing costs and increasing production throughput and is a logical step towards testing and burn-in of an entire wafer.

The various types of interconnection methods used to test these devices include permanent, semi-permanent, and temporary attachment techniques. The permanent and semi-permanent techniques that are typically used include soldering and wire bonding to provide a connection from the IC device to a substrate with fan out wiring or a metal lead frame package. The temporary attachment techniques include rigid and flexible probes that are used to connect the IC device to a substrate with fan out wiring or directly to the test equipment.

The permanent attachment techniques used for testing integrated circuit devices such as wire bonding to a leadframe of a plastic leaded chip carrier are typically used for devices that have low number of interconnections and the plastic leaded chip carrier package is relatively inexpensive. The device is tested through the wire bonds and leads of the plastic leaded chip carrier and plugged into a test socket. If the integrated circuit device is defective, the device and the plastic leaded chip carrier are discarded.

The semi-permanent attachment techniques used for testing integrated circuit devices such as solder ball attachment to a ceramic or plastic pin grid array package are typically used for devices that have high number of interconnections and the pin grid array package is relatively expensive. The device is tested through the solder balls and the internal fan out wiring and pins of the pin grid array package that is plugged into a test socket. If the integrated circuit device is defective, the device can be removed from the pin grid array package by heating the solder balls to their melting point. The processing cost of heating and removing the chip is offset by the cost saving of reusing the pin grid array package.

The most cost effective techniques for testing and burn-in of integrated circuit devices provide a direct interconnection between the pads on the device to a probe sockets that is hard wired to the test equipment. Contemporary probes for testing integrated circuits are expensive to fabricate and are easily damaged. The individual probes are typically attached to a ring shaped printed circuit board and support cantilevered metal wires extending towards the center of the opening in the circuit board. Each probe wire must be aligned to a contact location on the integrated circuit device to be tested. The probe wires are generally fragile and easily deformed or damaged. This type of probe fixture is typically used for testing integrated circuit devices that have contacts along the perimeter of the device. This type of probe is also much larger than the IC device that is being tested and the use of this type of probe for high temperature testing is limited by the probe structure and material set. This is described with reference to applicant's co-pending U.S. application Ser. No. 08/754,869 filed on Nov. 22, 1996.

Another technique used for testing IC devices comprises a thin flex circuit with metal bumps and fan out wiring. The bumps are typically formed by photolithographic processes and provide a raised contact for the probe assembly. The bumps are used to contact the flat or recessed aluminum bond pads on the IC device. An elastomer pad is typically used between the back of the flex circuit and a pressure plate or rigid circuit board to provide compliance for the probe interface. This type of probe is limited to flexible film substrate materials that typically have one or two wiring layers. Also, this type of probe does not provide a wiping contact interface to ensure a low resistance connection.

The aluminum bond pads on a high density IC device are typically rectangular in shape and are recessed slightly below the surface of the passivation layer. If the wiping action of the high density probe is not controlled, the probe contact may move in the wrong direction and short to an adjacent aluminum bond pad or the probe contact may move off of the aluminum bond pad onto the surface of the passivation layer and cause an open connection.

Gold plated contacts are commonly used for testing and burn-in of IC devices. The high temperature test environment can cause diffusion of the base metal of the probe into the gold plating on the surface. The diffusion process creates a high resistive oxide layer on the surface of the probe contact and reduces the probe life.

The position of the probe tips must be controlled to ensure accurate alignment of the probes to the interconnection pads on the IC device.

During high temperature burn-in testing, the thermal expansion mismatch between the probe structure and the IC device is preferably small to ensure that the probe position does not vary significantly over the burn-in temperature range. Thermal expansion mismatch within the probe structure can result in contact reliability problems.

The challenges of probing a single high density integrated circuit device are further multiplied for multi-chip and full wafer testing applications. Probe fabrication techniques and material selection are critical to the thermal expansion and contact alignment considerations. A small difference in the thermal expansion of the substrate, wafer, and probe construction will cause misalignment of the probe tip to the wafer contact pad. Compliance of the probe structure is another critical factor. Slight variations in the wafer metallization, warpage of the wafer, and slight variations in the probe height contribute to the total compliance requirements for the probe structure.

The prior art described below includes a several different probe fixtures for testing bare IC chips.

U.S. Pat. No. 5,177,439, issued Jan. 5, 1993 to Liu et al. is directed to fixtures for testing bare IC chips. The fixture is manufactured from a silicon wafer or other substrate that is compatible with semiconductor processing. The substrate is chemically etched to produce a plurality of protrusions to match the I/O pattern on the bare IC chip. The protrusions are coated with a conductive material and connected to discrete conductive fanout wiring paths to allow connection to an external test system. The probe geometry described in this patent does not provide a compliant interface for testing the aluminum bond pads on the IC device and does not provide a wiping contact interface. The substrate used for fabrication of this probe fixture is limited to semiconductor wafers which are relatively expensive.

Applicant's co-pending U.S. application Ser. No. 08/754,869, filed on Nov. 22, 1996, the teaching of which is incorporated herein by reference, describes a high density test probe for integrated circuit devices. The probe structure described therein uses short metal wires that are bonded on one end to the fanout wiring on a rigid substrate. The wires are preferably encased in a compliant polymer material to allow the probes to compress under pressure against the integrated circuit device. The wire probes are sufficiently long and formed at an angle to prevent permanent deformation during compression against the integrated circuit device.

OBJECTS

It is the object of the present invention to provide a probe for testing electronic devices and other electronic components that use bond pads for the interconnection means.

Another object of the present invention is to provide a probe structure that is an integral part of the fan out wiring on the test substrate or other printed wiring means to minimize the electrical conductor length as well as the contact resistance of the probe interface.

A further object of the present invention is to provide a probe with a compliant interface to compensate for slight variations in the rigid bond pad heights on the IC device and variations in the height of the probe contacts.

An additional object of the present invention is to provide a raised probe tip for contacting recessed surfaces on the IC device.

Yet another object of the present invention is to provide a probe with a wiping contact interface where the direction and length of the contact wipe is controllable.

Yet a further object of the present invention is to provide a probe construction that has thermal expansion characteristics that are matched to the IC device to be tested or burned-in at high temperature.

Yet an additional object of the present invention is to provide a probe construction that has high durability and reliability for repeated thermal and mechanical cycling.

Yet another object of the present invention is to provide a probe structure that can be used for single chip or multiple chip wafer testing.

Yet another object of the present invention is to provide a probe structure that has an improved true position tolerance.

Yet another object of the present invention is to provide a probe structure that does not require an elastomer material to support the individual probe wires.

It is another object of the present invention to provide a high density probe with controlled wipe can be fabricated on a variety of inexpensive substrate with the fanout wiring.

SUMMARY OF THE INVENTION

A broad aspect of the present invention is a structure comprising a substrate having a surface; a plurality of elongated electrical conductors extending away from the surface; each of said elongated electrical conductors having a first end affixed to the surface and a second end projecting away from the surface; there being a plurality of second ends; and a means for maintaining the plurality of the second ends in substantially fixed positions with respect to each other. In a more particular aspect of the present invention in the structure is useful as a probe to test and burn-in integrated circuits, in particular at the water level.

In another more particular aspect of the present invention the probe is incorporated onto a test apparatus.

BRIEF DESCRIPTION OF THE DRAWINGS

These and other objects, features, and advantages of the present invention will become apparent upon further consideration of the following detailed description of the invention when read in conjunction with the drawing figures, in which.

showed "C" shaped, continuously curved, piece wire curved, piece wire linear and combinations thereof.

Figure 16:
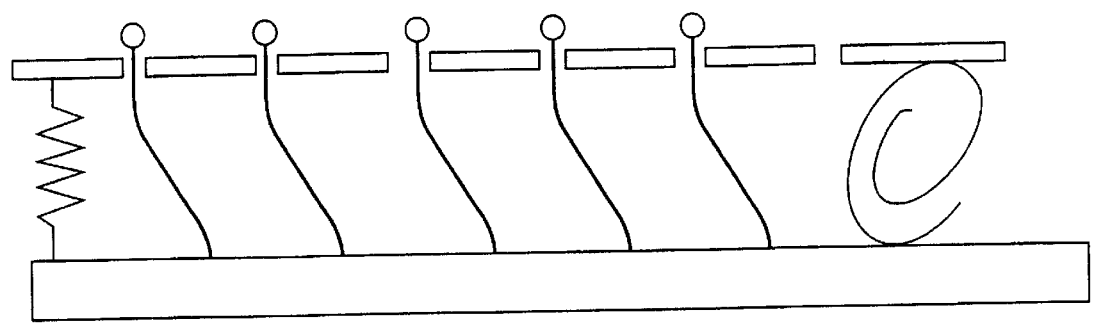

FIG. 16 schematically shows alternative embodiments of compliant frame structures (17) to support probe tip positioning structure (20) to be maintaining in position and to move as the probe tip ends (16) move when they are moved into engagement with electronic device pads (31).

Figure 17:
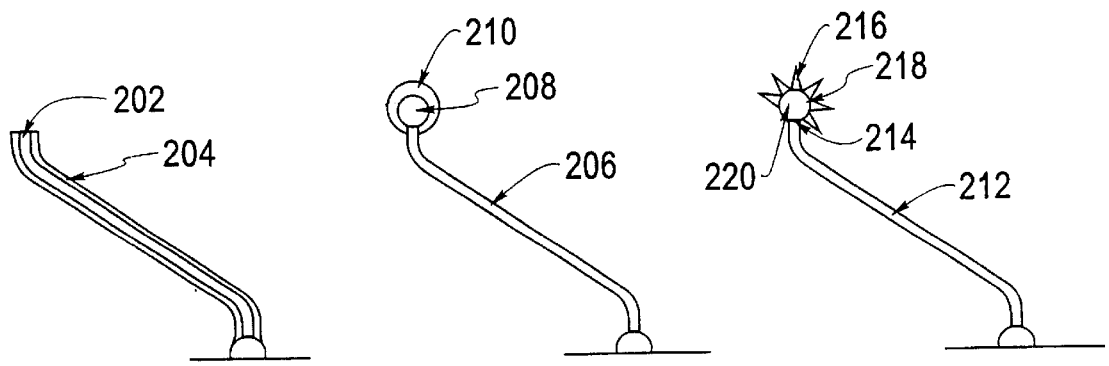

FIG. 17 schematically shows elongated conductors having coatings over the entire conductor or at least at the ends.

Figure 18:
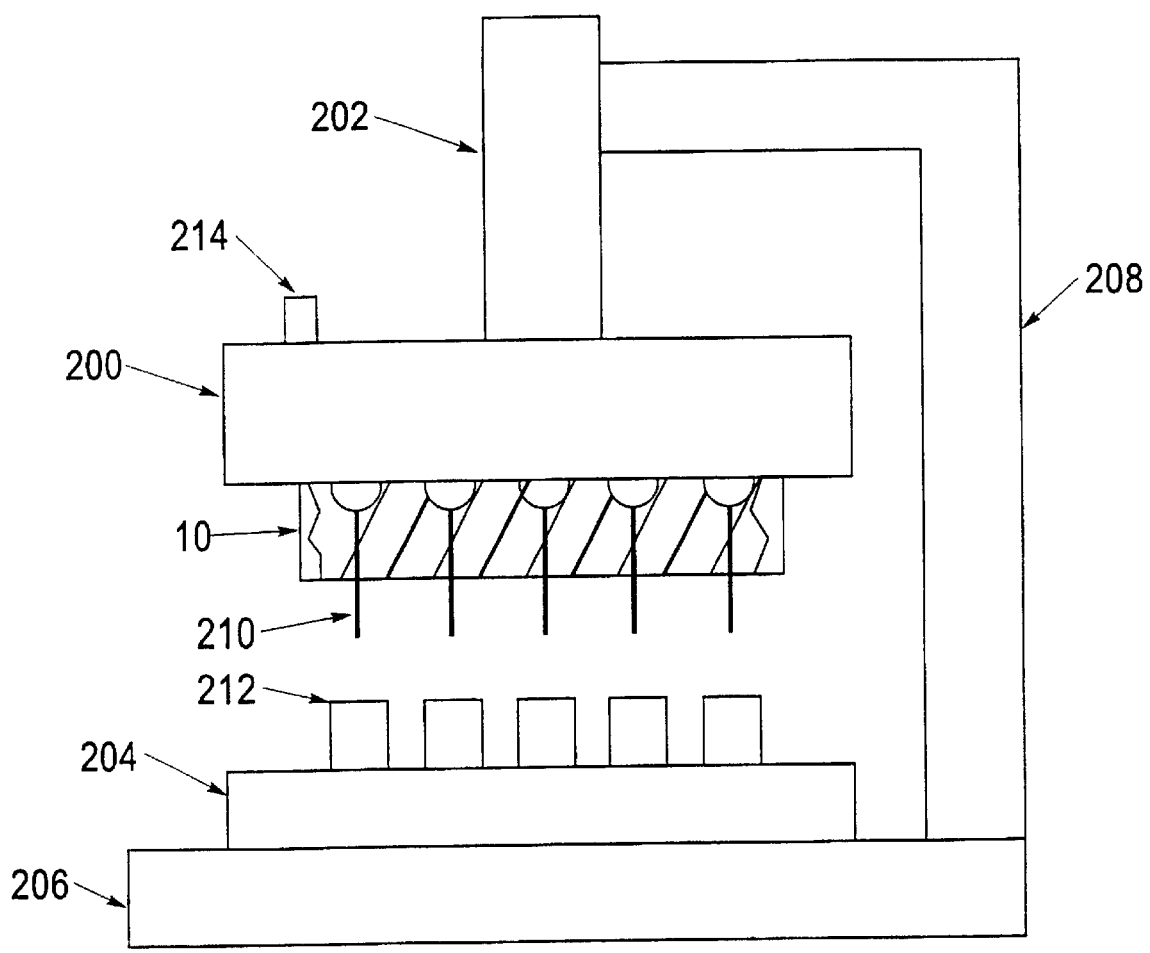

FIG. 18 schematically shows an apparatus for moving the probes according to the present invention into an out of electrical engagement with a workpiece, such as on an integrated circuit (IC), being tested.

DETAILED DESCRIPTION

Figure 1:
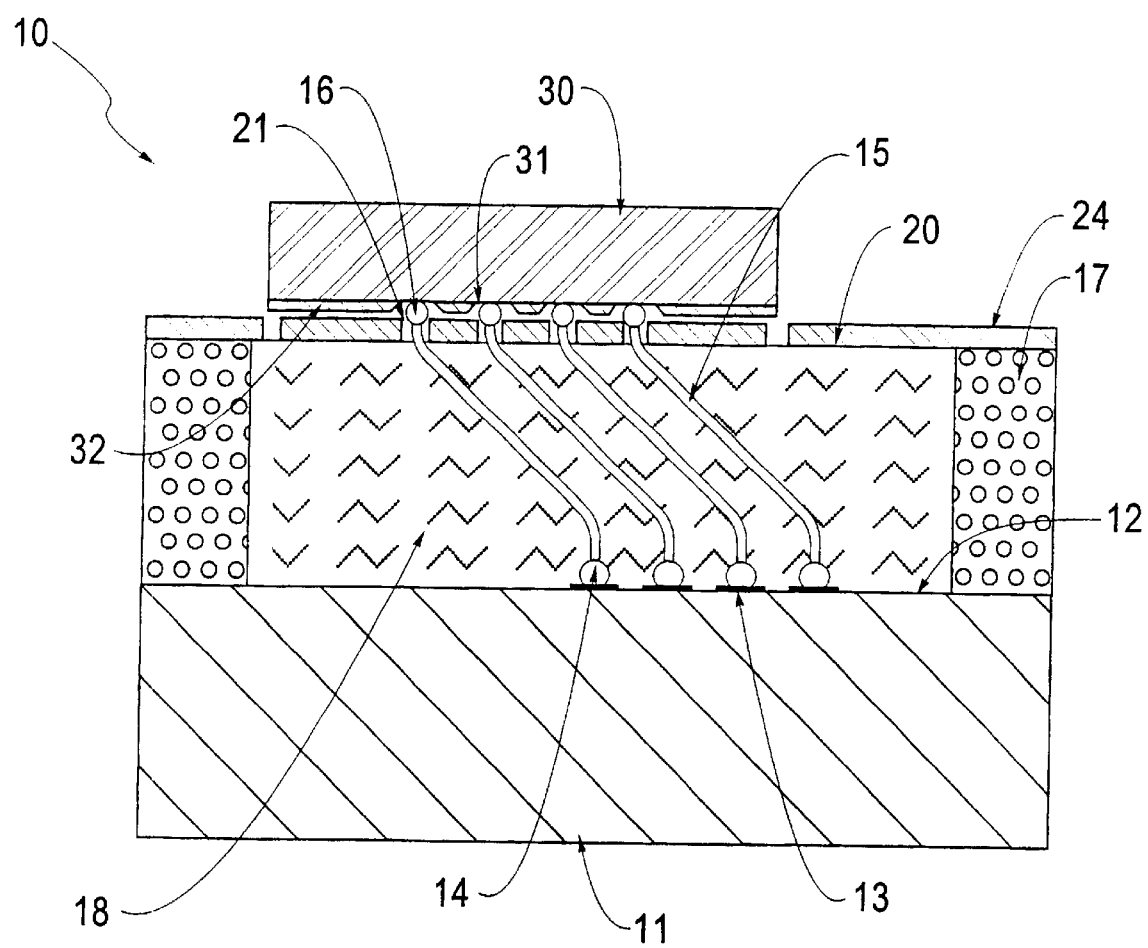
FIG. 1 shows a cross section of a preferred embodiment of the compliant test probe attached to a substrate and pressed against the aluminum bond pads, such as aluminum pads, on an integrated circuit device.

FIG. 1 shows a cross section of a test substrate (11) and a compliant test probe (10) according to the present invention. The test substrate (11) provides a rigid base for attachment of the probes (10) and fan out wiring from the high density array of probe contacts to a larger grid of pins or other interconnection means to the equipment used to electrically test the integrated circuit device. The fan out substrate can be made from various materials and constructions including single and multi-layer ceramic with thick or thin film wiring, silicon wafer with thin film wiring, or epoxy glass laminate construction with high density copper wiring. The test probes (10) are attached to the first surface (12) of the substrate (11). The probes are used to contact the bond pads (31), typically fabricated from aluminum, on the integrated circuit device (30). The bond pads (31) are typically recessed slightly below the surface of the passivation layer (32) of the integrated circuit device (30). The geometry of the compliant test probe (10) is optimized to provide a wiping contact interface to penetrate the oxides on the surface of the aluminum bond pads (31) to provide a low resistance connection. The substrate (11) can be a circuitized substrate typically used to provide a packaging substrate to mount an integrated circuit thereon, such packaging substrates are typically metallized ceramic and glass ceramic substrates and metallized polymer substrates usually referred to as printed circuit boards.

The test probe (10) is attached directly to the fan out wiring (13) on the first surface (12) of the substrate (11) to minimize the resistance of the probe interface. This can be achieved by building test probe (10) on surface (12) or by separately building substrate (10) separately and thereafter attaching it to surface (12) such as by adhesive bonding. The probe geometry is optimized to provide a flexible contact interface that controls the direction and length of the wiping action. Flexibility is provided preferably by using an elastomeric material to fabricate probe (W). However, any other means of providing compliance can be used, such as by a mechanical construction. The elastomer material (18) surrounding the probes provides an compliant structure and the sheet (20) is used to control the position of the probe tips (16). Sheet (20) is typically thin (preferably less than 10 mils) and made of a rigid material such as a metal copper, aluminum, Invar, molybdenum and Cu/Invar/Cu, but can be a polymer sheet such as a polyimide or inorganic sheet such as a ceramic or silicon or glass or a dielectric material sheet. The sheet is most preferably Invar. The thin Invar sheet (20) is coated with an thin layer of material (24) to insulate the Invar sheet (20) from the probe wire (15) and tip (16). The true position tolerance of the probe tips (16) is enhanced by using a plurality of small holes (21) in the thin Invar sheet (20). The diameter of the holes (21) in the thin Invar sheet (20) are preferably only slightly larger than the diameter of the probe wire (15) and the holes (21) are preferably created using a precision chemical etching process. The diameter (d) of holes (21) as compared to the diameter (r) of area (15) determines the extent to which the tips (16) move away from an initial position as the probe (10) is pressed against a work piece to be tested. Probe tips (16) are typically designed to be aligned with the center of the pad to be probed. The probe tip (16) can move laterally by a distance of approximately 1–3 mils. If the pad is a circle of diameter (p) then d is preferably less than or equal to r. If the pad is a square of side (I), then d is preferably less than or equal to I/2. This constraint on d permits probe tips (16) to move about laterally without sliding of the pad (16). If the only concern is that a probe tip (16) not slide into an adjacent pad, then d is less than about one half the distance between pads. As the compliant high density probe (10) is pressed against the IC device (30), the probe wire (15) rotates slightly and the probe tip (16) slides along the surface of the bond pads (31) of the IC device (30). The length of the sliding or wiping action is restricted by the angle and length of the probe wire (15) and the amount of compression of the probe (10). The probe (10) mounted on substrate (11) is designed and adapted for being moved by a means for moving probe (10) towards electronic device (30) so that probe tips (16) are moved towards pads (21) on electronic device (30) so that probe tips (16) contact pads (21) sot that probe (10) can be used to electrically test and burn in device (30).

Figure 2:
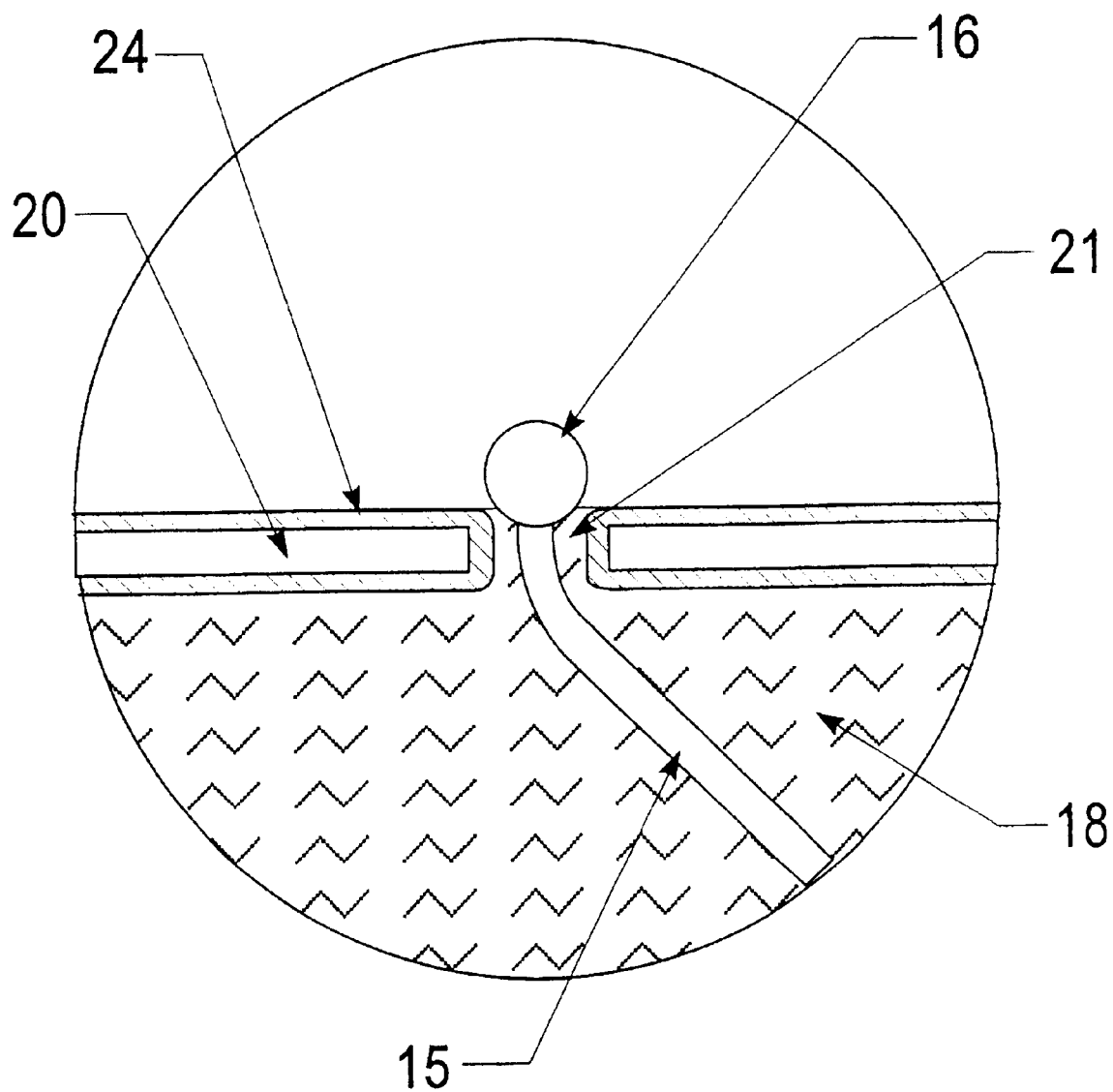
FIG. 2 shows a magnified cross section of a preferred embodiment of the compliant test probe.

FIG. 2 shows a magnified cross section of a preferred embodiment of the complaint test probe. The thin sheet (20) can be insulated by conformally coating a thin layer of either an organic or an inorganic material on both surfaces and into the holes (21) in the thin sheet (20). The organic coating, for example, could be Parylene C, Parylene D or Parylene F, or any other types known in the arts. Coating (24) is most desirable if sheet (20) is an electrically conducting material. If sheet (20) is electrically conducting, sheet (20) can be electrically biased, such as being held at ground potential to provide electrical shielding between electrical conductors (15) and between electrically conductive pads (31) to avoid crosstalk between conductors (15) and pads (31).

Figure 3:
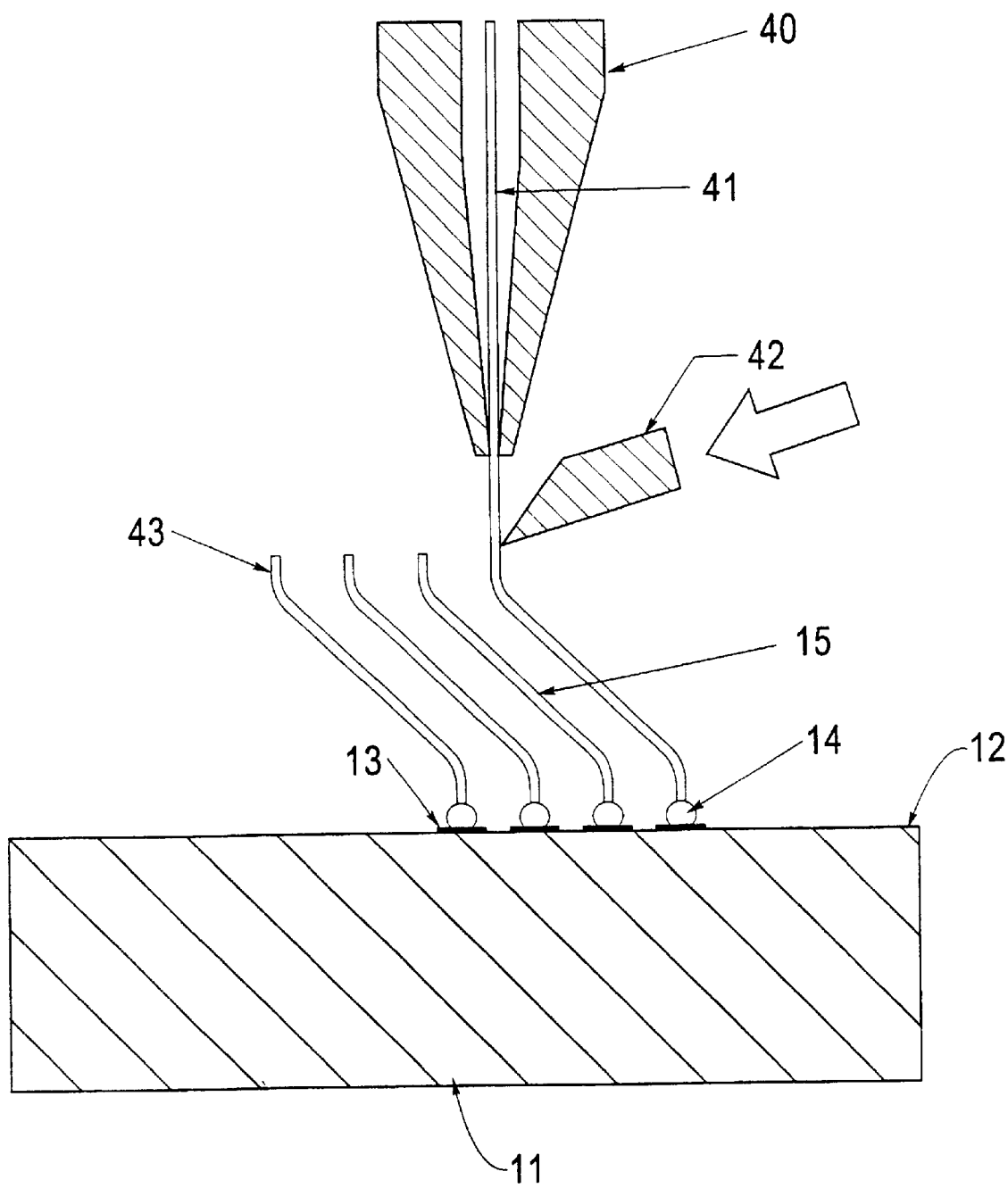
FIGS. 3–5 show the processes used to fabricate the compliant test probe on a fan out wiring substrate.
Figure 15:
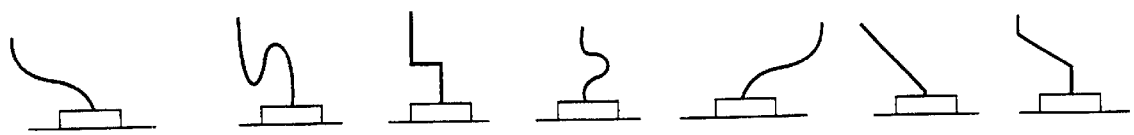
FIG. 15 schematically shares a variety of shapes of probe wires useful to practice the present invention, such as "S"

FIG. 3 shows a first process used to fabricate the compliant test probe (10). A thermosonic wire bonder tool is used to attach ball bonds (14) to the fan out wiring (13) on the first surface (12) of the substrate (11) which is preferably rigid. The wire bonder tool uses a first, preferably ceramic, capillary (40) to press the ball shaped end (14) of the bond wire (41) against the wiring (13) on the first surface (12) of the substrate (11). Compression force and ultrasonic energy are preferably applied through the first capillary (40) tip and thermal energy is preferably applied from the wire bonder stage through the substrate (11) to bond the ball shaped end (14) of the bond wire (41) to the fan out wiring (13) on the first surface (12) of the substrate (11). The bond wire (41) is positioned at an angle and a shear blade (42) is used to sever the bond wire (41) to create an angled segment of wire (15) protruding away from the ball bond (14) initially vertically away from ball (14). The movement of the capillary (40) is controlled during this process to provide a short straight section of the wire (43) that is preferably perpendicular to the surface of the rigid substrate (11). By controlling the relative movement between capillary (40) and substrate (11) a variety of shapes of wire (15) can be achieved, such as continuously curved. FIG. 15 schematically shows examples of shapes.

Figure 4:
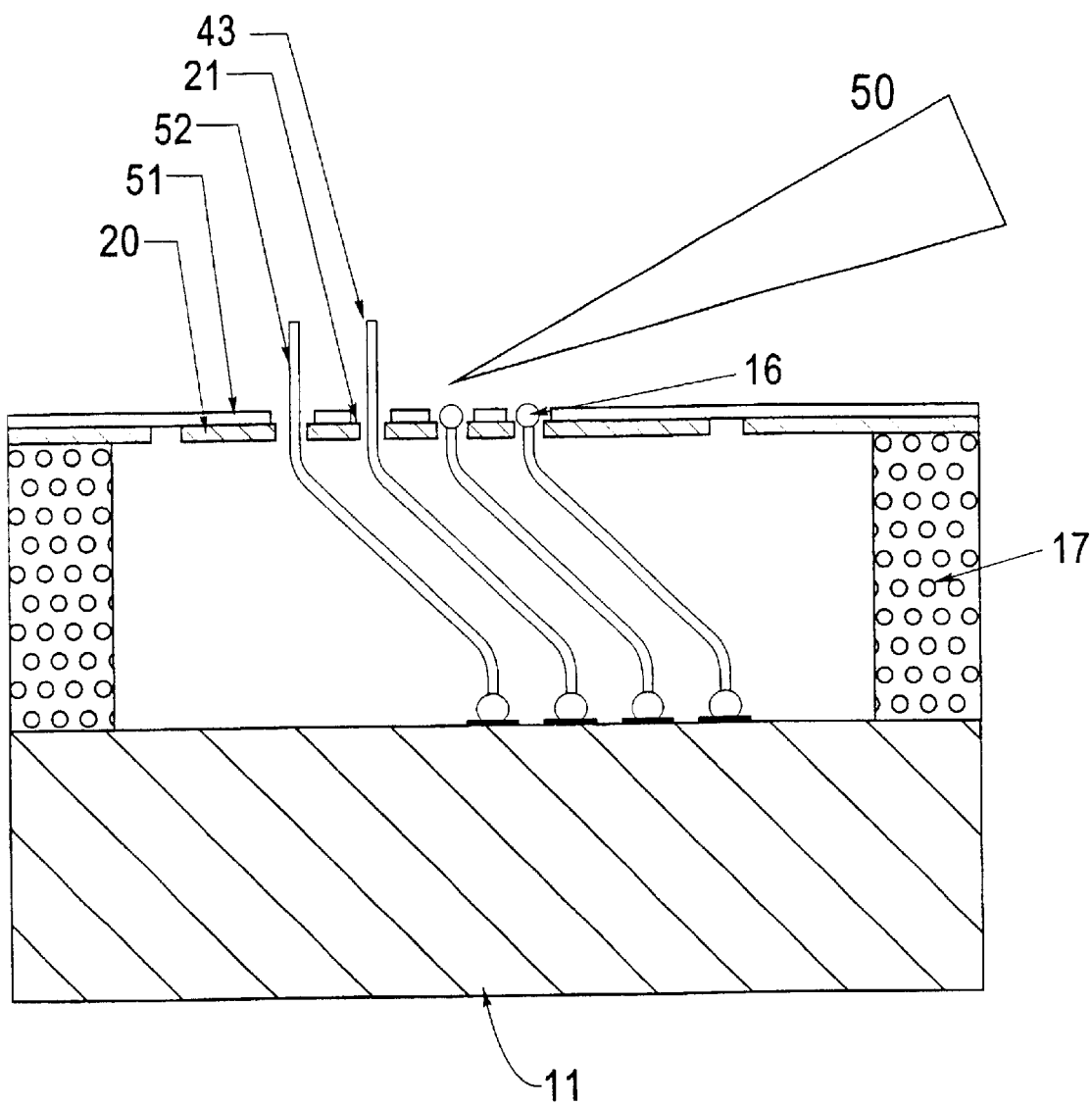

FIG. 4 shows (preferably an argon-ion) laser (50) used to melt the ends of the short straight sections of the wire (15)

to create a ball shaped contact (16). A thin sheet (20) with holes (21) corresponding to the ends of the probe wires (15) is placed over the array of wires (15) and supported by a preformed frame (17). The thin sheet (20) preferably has a thickness from 1–10 mills. The polymer coating (24) on the thin Invar sheet (20) is applied prior to this process. The preformed frame (17) which is preferably made of a high compliance foamed elastomer material. Alternatively, frame (17) can be a spring. A thin (preferably metal) metal mask (51) with precision located holes (52) corresponding to the ends of the probe wires (15) is placed over the array of wires (15). The mask (51) protects the polymer coating (24) on the thin Invar sheet (20) from the (preferably argon-ion) laser (50) while the ball shaped contacts (16) are being formed on the ends of the probe wires (15). Mask (51) is made of a material which blocks, such as by absorption, the laser from reaching the polymer coating (24). The smooth surface of the ball shaped contact (16) is ideal for a wiping interface. The size of the ball shaped contact (16) on the end of the probe wire (15) is controlled by the laser power density and the alignment of the focal point of the sense focusing the laser beam from the tip of the straight wire section (43). The diameter of the holes (52) in the thin metal mask (51) are preferably slightly larger than the diameter of the ball shaped contacts (16) to allow the mask (51) to be removed after the balls (16) are formed.

Figure 5:
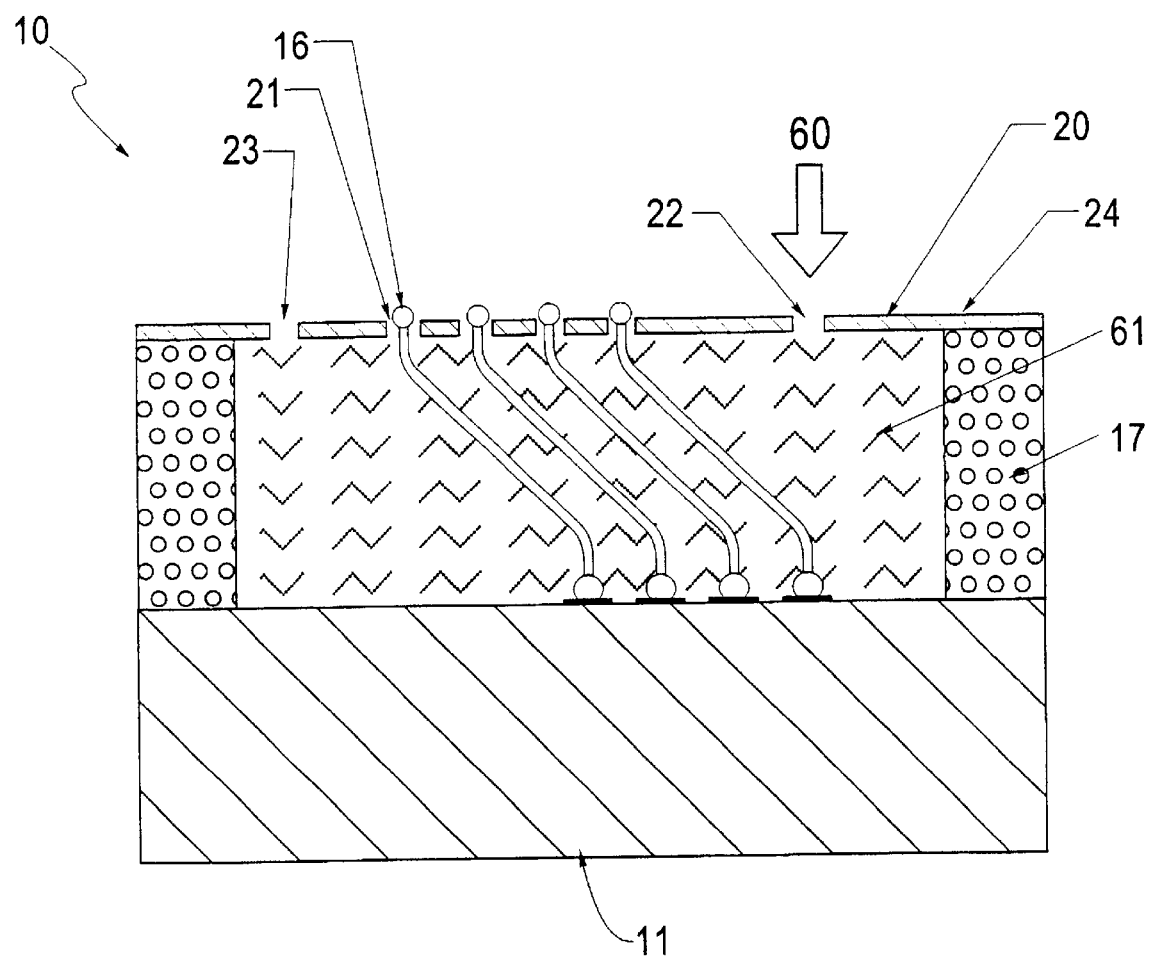

The space between the probe wires (15) is preferably filled with an elastomer. FIG. 5 shows a process used to fill the empty space between the array of high density probes (15) with a liquid elastomer resin (61). Preferably the preformed elastomer frame (17) supporting the thin Invar sheet (20) acts as a casting dam to contain the liquid elastomer resin (61) until it is cured. A controlled volume (60) of liquid elastomer resin (61) is dispensed into the cavity through a small opening (22) in the thin sheet (20) preferably using a syringe and a small capillary tube. The liquid elastomer resin (61) is forced into the cavity under pressure similar to an injection molding process. The liquid elastomer resin (61) can also be injected into the probe cavity through an opening in the preformed elastomer frame (17). The height of the elastomer resin (61) is controlled by the presence of the thin sheet (20), the ball shaped contacts (16), and the preformed elastomer frame (17). Any excess elastomer resin (61) will be forced out of second small hole (23) in the thin sheet (20). After the cavity is completely filled, the probe assembly is placed in an oven to cure the elastomer resin (61).

FIGS. 1–5 show a method of forming a probe structure for a single IC device. This method can be used to fabricate an array of test probe structures on a single substrate.

Figure 6:
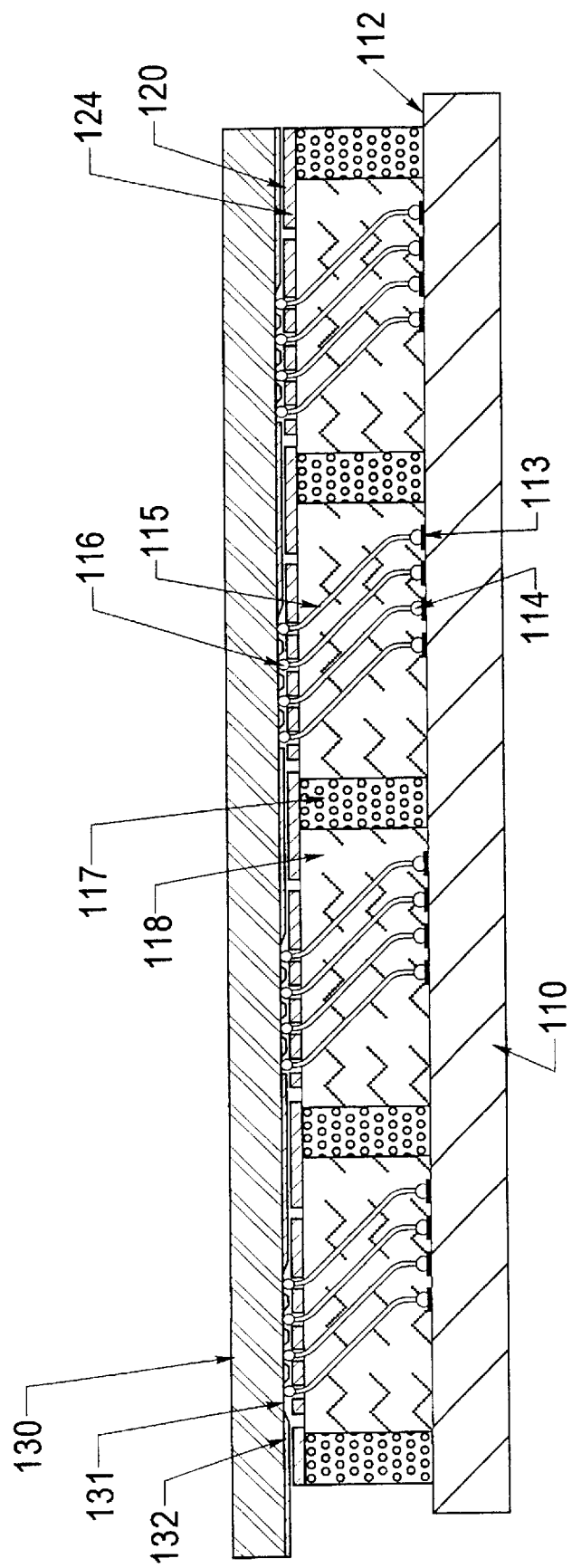
FIG. 6 shows a cross section of a preferred embodiment of the compliant test probe array for testing multiple IC devices on a single wafer.

FIG. 6 shows a cross section of a compliant test probe array (100) for testing multiple IC devices on a single wafer. The integrated test probe (100) shown in FIG. 6 includes four distinct probe arrays used to test individual IC devices on the water (130). The construction of each distinct probe array is identical to that shown in FIG. 1. The substrate (110) used as the base for building the test probe has an array of pads (113) on the top surface (112) that matches the pattern of contacts (131) on the wafer (130) to be tested. The test probes are bonded to these pads (113) and formed at an angle or in an arbitrary shape as described in the FIGS. 3 to 6 and 15. The angle or shape of the bond wires (115) are preferably the same to ensure accurate positioning of the ball shaped contact (116) on the end of the probe. Uniform material properties and uniform height of the elastomer material (118) are preferable to provide optimum compliance and contact normal force across the entire surface of the probe array. Although FIG. 6 shows the preformed elastomer frame (117) located between each array of probes, the elastomer frame (117) can be selectively arranged to minimize the spacing between probe arrays.

Figure 7:
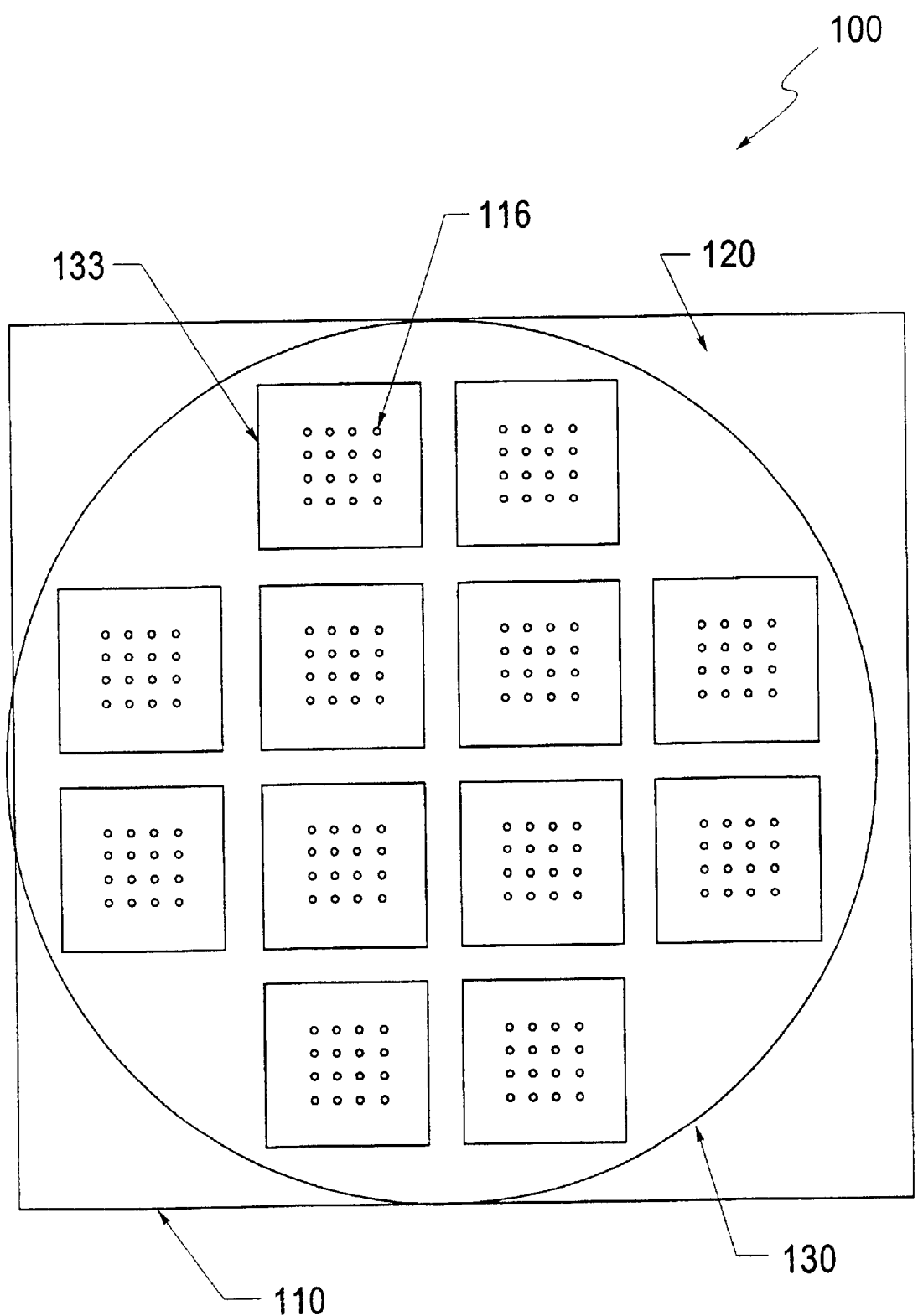
FIG. 7 shows a top view of a compliant test probe array for testing all of the IC devices on a single wafer.

FIG. 7 shows a top view of a compliant test probe array (100) for testing all of the IC devices on a single wafer the outline of which is shown as (130). The integrated test probe (100) shown in FIG. 7 includes twelve distinct probe arrays used to test all of the IC devices on the wafer (130). The outline of the wafer (130) and the individual IC devices (133) are shown with broken or dashed lines. The location of each array of probes corresponds with the pads on each of the individual IC devices (133) on the wafer (130). The location of the ball shaped ends (116) of the test probes is accurately controlled by the location of the openings in the thin sheet (120).

Figure 8:
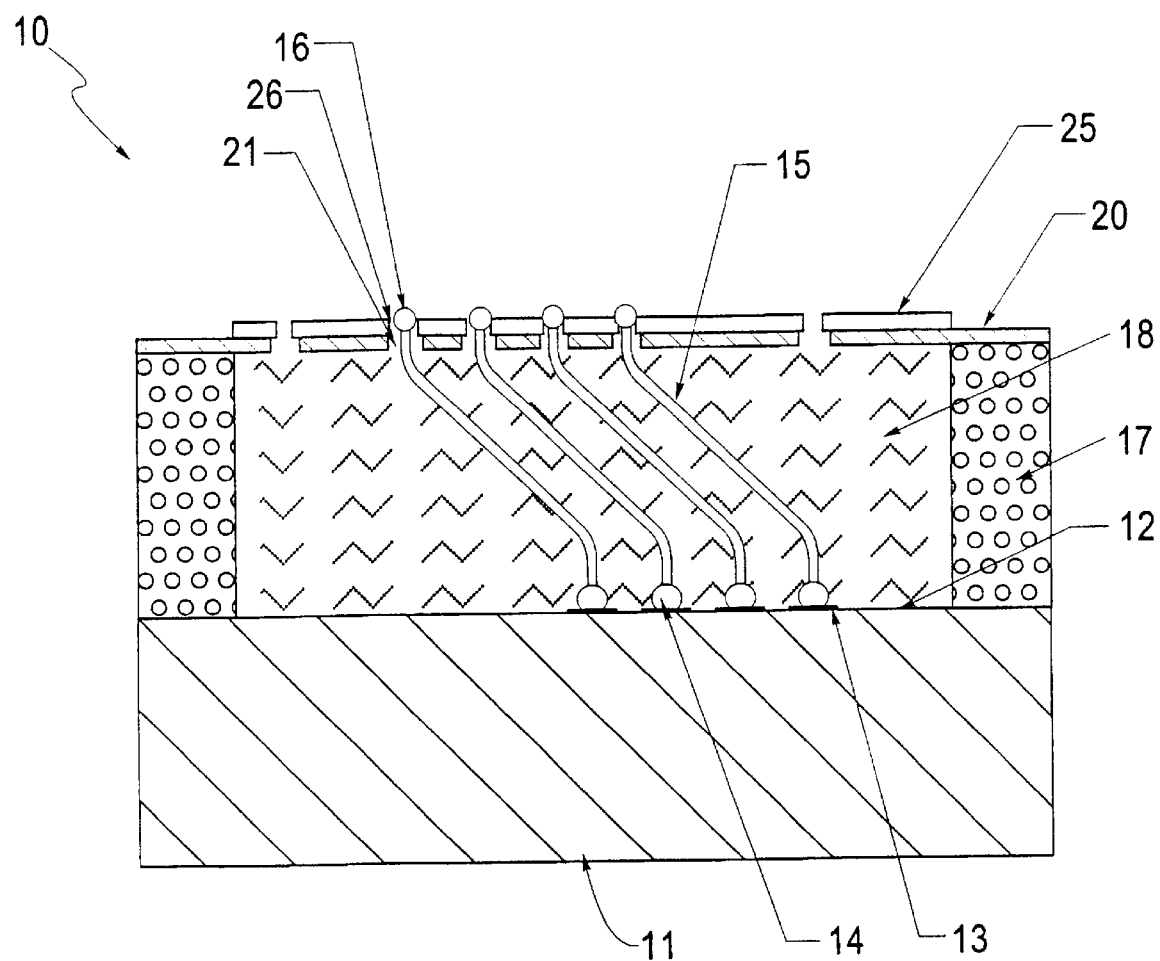
FIG. 8 shows a cross section of a first alternate embodiment of the compliant test probe.
Figure 9:
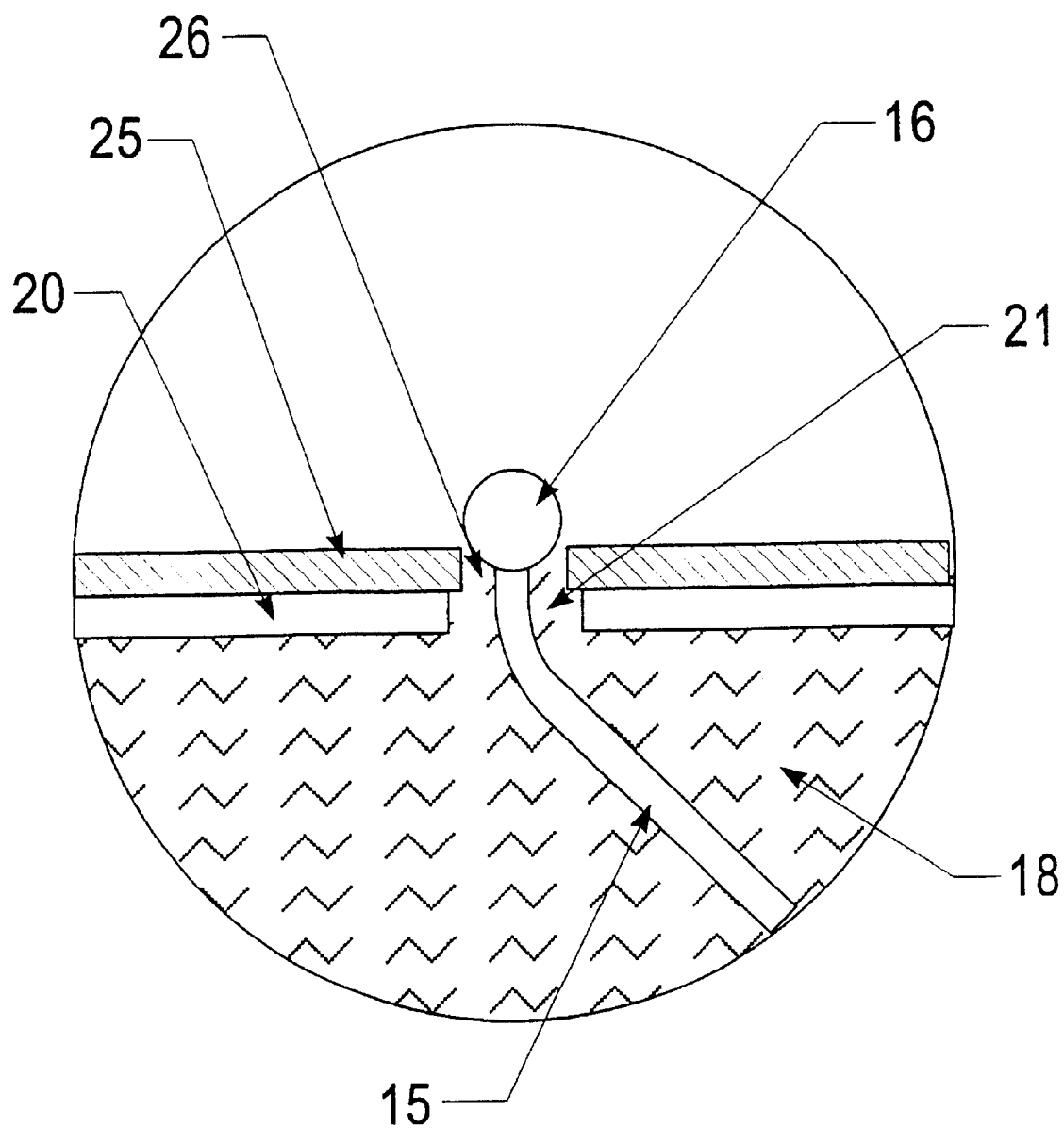
FIG. 9 shows a magnified cross section of a first alternate embodiment of the compliant test probe.

FIG. 8 shows a cross section of another embodiment of a compliant test probe. The first alternate embodiment uses a thin sheet (20) similar to the embodiment of FIGS. 1–6 without the polymer coating and the diameter of the holes (21) in the {preferably of electrically conductive, such as Invar sheet (20)} are slightly larger. A thin polymer sheet (25) with smaller diameter holes (26) is laminated over the thin sheet (20). The thin polymer sheet can be polyimide, mylar and polyethylene. This list is exemplary only and not limiting. The smaller diameter holes (26) are slightly larger than the probe wire (15) diameter and are used to provide accurate alignment of the probe contacts (16). The smaller diameter holes (26) also prevent the probe wires (15) from making contact with the sides of the holes (21) in the conductive sheet (20). The thin polymer sheet (25) is preferably segmented and bonded to the thin sheet (20) to eliminate TCE mismatch problems over large surface areas. A second thin polymer sheet could be laminated or spin-coated on the bottom side of the thin sheet (20), opposite to the first thin polymer sheet (25), to avoid possible bowing problems. FIG. 9 shows a magnified section of the embodiment of FIG. 8 with the larger holes (21) in the thin Invar sheet (20) and the smaller holes (26) in the thin polymer sheet (25).

Figure 10:
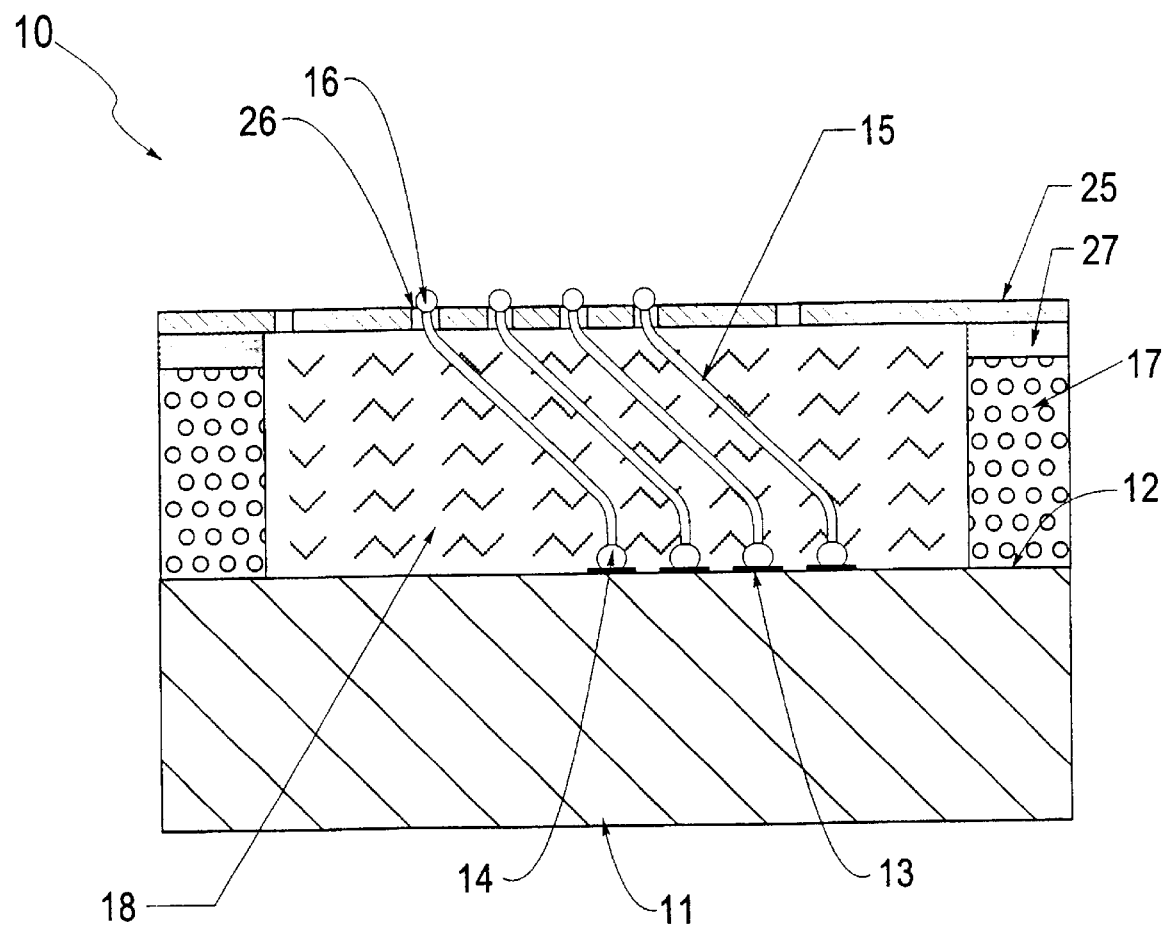
FIG. 10 shows a cross section of a second alternate embodiment of the compliant test probe.

FIG. 10 shows a cross section of another embodiment of the compliant test probe which uses a thin polymer sheet (25) with small holes (26) to control the location of the probe wires (15). The thin polymer sheet (25) is attached to a thin (preferably rigid, such as Invar) frame (27) that surrounds each array or cluster of probes. The thin polymer sheet (25) is preferably segmented and bonded to the thin frame (27) to eliminate TCE mismatch problems over large surface areas.

Figure 11:
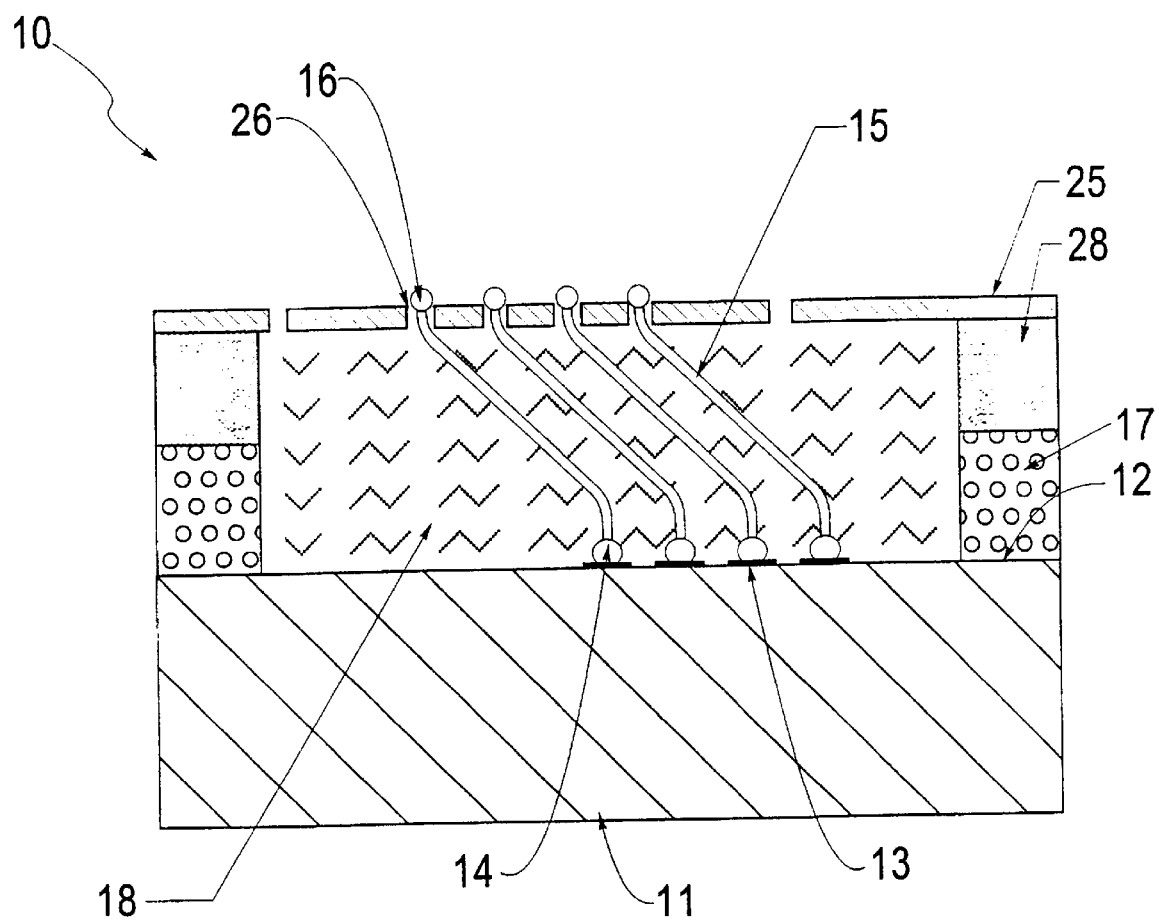
FIG. 11 shows a cross section of a third alternate embodiment of the compliant test probe.

FIG. 11 shows a cross section of another embodiment of the compliant test probe which uses a thin (preferably Invar) sheet (20) with a thin polymer coating (24) and small diameter holes (21) to control the location of the probe wires (15). The sheet (20) is attached to a thick (preferably Invar) frame (28). The thickness of the frame (28) can be modified to control the total compliance of the test probes (10).

Figure 12:
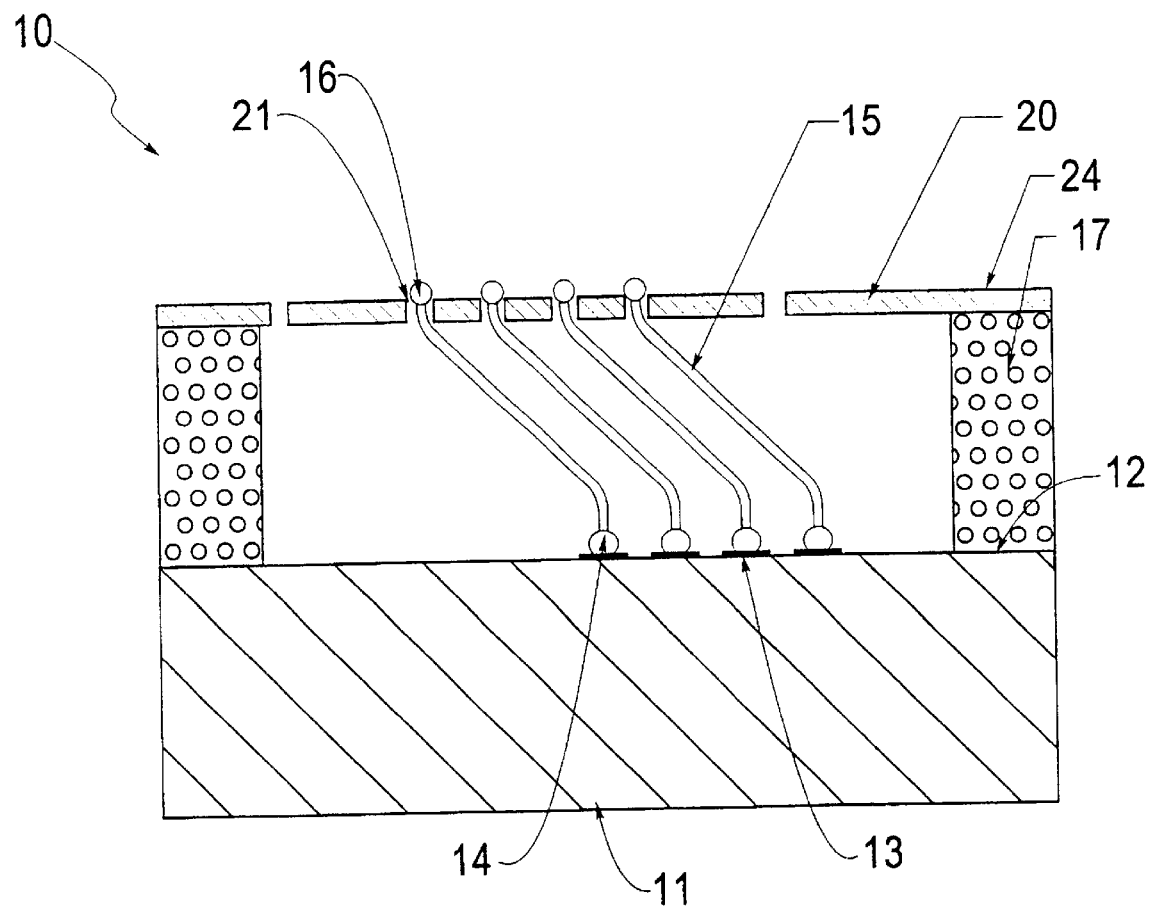
FIG. 12 shows a cross section of a fourth alternate embodiment of the compliant test probe.

FIG. 12 shows a cross section of another embodiment of the compliant test probe. The forth alternate embodiment is identical to the preferred embodiment with the exception of the elastomer material surrounding the individual probe wires (15). The compliant test probes (10) are supported by the thin (preferably Invar) sheet (20) and the preformed elastomer frame (17).

Figure 13:
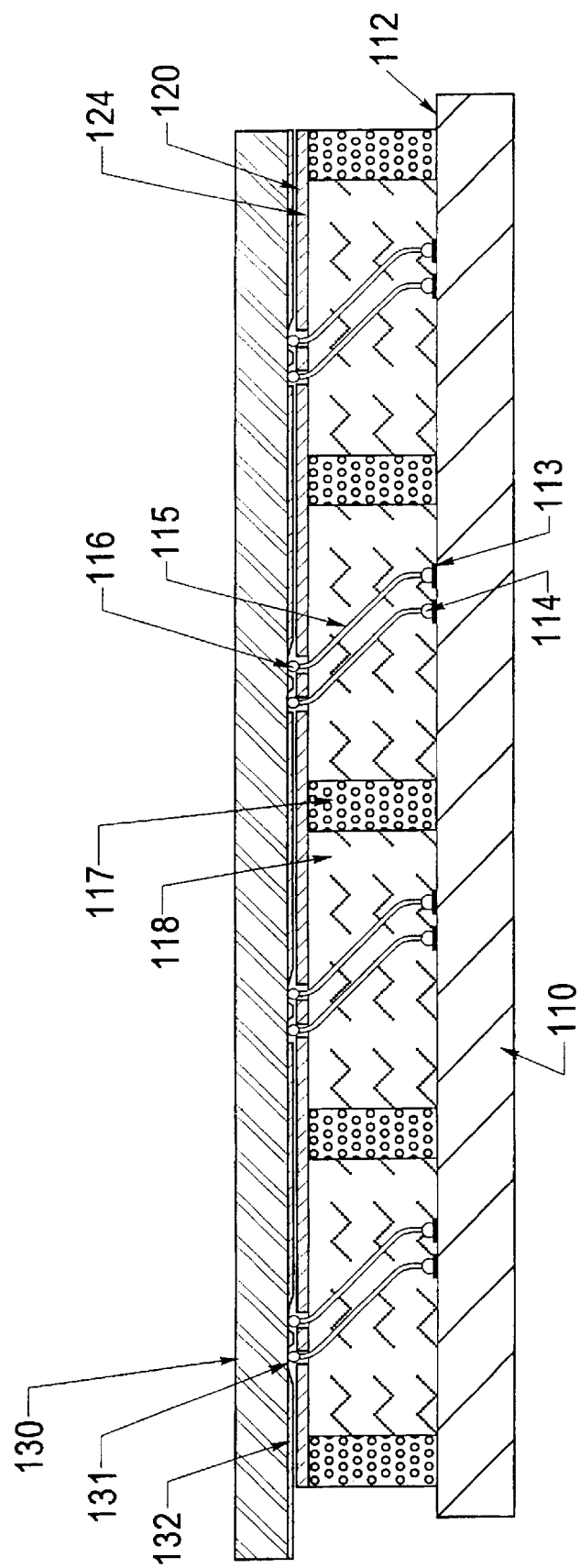
FIG. 13 shows a cross section of a fifth alternate embodiment of the compliant test probe array for testing multiple IC devices on a single wafer.
Figure 14:
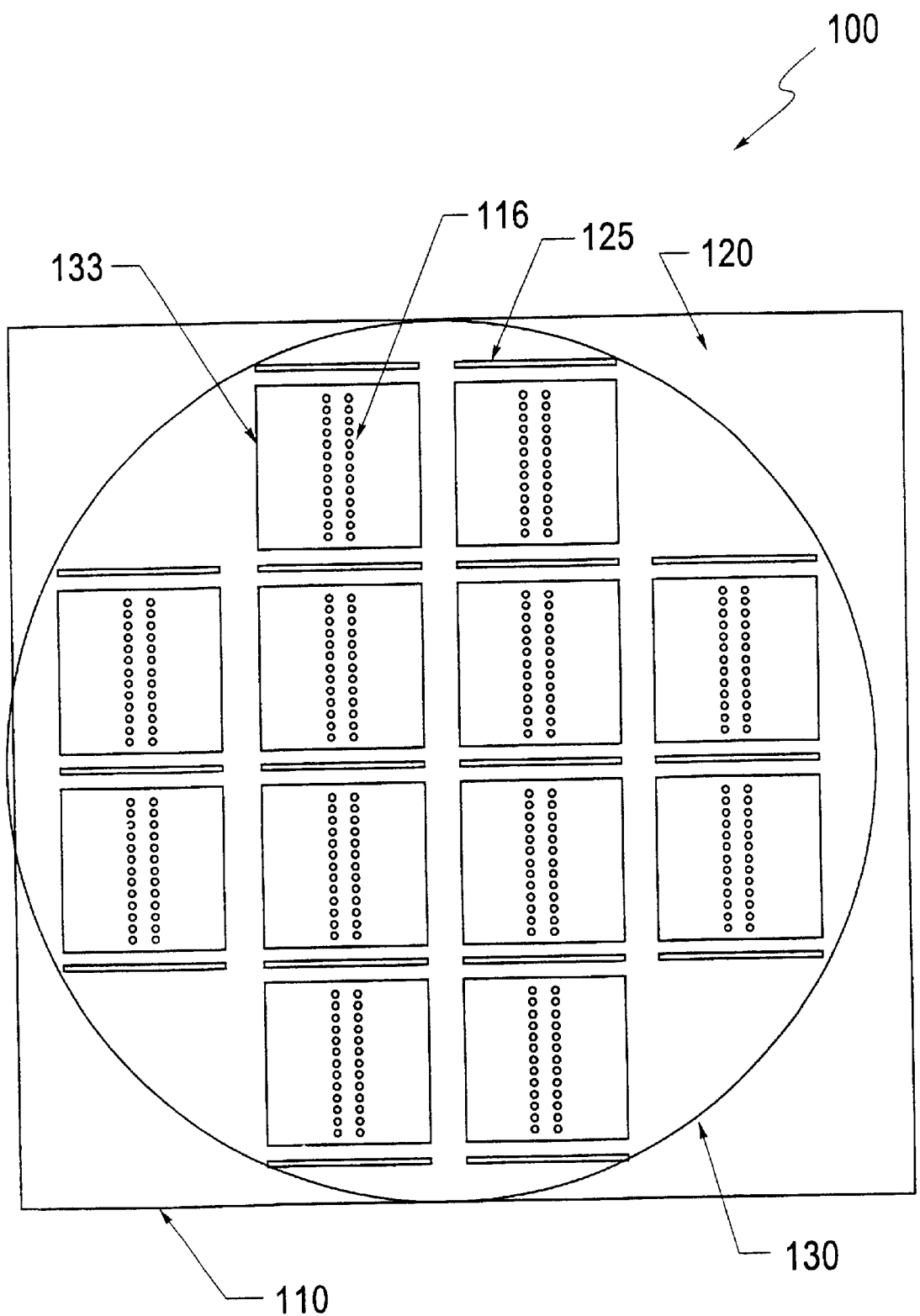
FIG. 14 shows a top view of a fifth alternate embodiment of the compliant test probe array for testing all of the IC devices on a single substrate.

FIGS. 13 and 14 show a cross section and top view of another embodiment of the compliant test probe array for testing multiple IC devices on a single wafer. The configuration of probes in this embodiment is typical of memory devices having two rows of contacts per device. Each array of probes is decoupled from the adjacent arrays by slots (125) in the thin (preferably Invar) sheet (120).

FIG. 15 schematically shares a variety of shapes of probe wires useful to practice the present invention, such as "S" showed "C" shaped, continuously curved, piece wire curved, piece wire linear and combinations thereof.

FIG. 16 schematically shows alternative embodiments of compliant frame structures (17) to support probe tip positioning structure (20) to be maintaining in position and to move as the probe tip ends (16) move when they are moved into engagement with electronic device pads (31).

FIG. 17 shows examples of elongated electrical conductors (202) having a coating (204) disposed thereon. Preferably coating (204) is at the surface of elongated conductor (202) leaving the end of conductor (202) exposed. Hard coating 204 can provide a reinforcing hard coat. Coating 204 is preferably a hard metal such as Pd, Pt, Ni, Au, Rh, Ru, Re, Cu, Co and their alloys, etc. Elongated conductor 206 has a protuberance 208 at the distal end having such a hard coating 210. Elongated conductor 212 has an end 214 with sharp spikes 216, preferably on the surface 218 of protuberance 220.

FIG. 18 schematically shows an apparatus for moving probe structure 10 towards and away from electronic device 204 so that probe tips 210 engage and disengage electrical contact locations 212 on electronic device 204. Probe 10 is mounted on to holder 200 having means 214 for applying electric power to the probe tips 210. Electronic device 206 is held on base 206. Holder 200 is physically connected to support 202 which is converted to arm 208 which is converted to base 206. Support 202 is adapted for up and down movement. Examples of an apparatus to provide the means for support and up and down movement can be found in U.S. Pat. No. 5,439,161 and U.S. Pat. No. 5,132,613, the teachings of which are incorporated herein by reference.

While we have described our preferred embodiments of our invention, it will be understood that those skilled in the art, both now and in the future, may make various improvements and enhancements which fall within the scope of the claims which follow. All references cited in this application herein are incorporated by reference herein.

The teaching of the following patent co-pending applications are incorporated herein by reference:

U.S. Pat. No. 5,371,654 entitled, "THREE DIMENSIONAL HIGH PERFORMANCE INTERCONNECTION PACKAGE";

U.S. patent application Ser. No. 08/614,417 entitled, "HIGH DENSITY CANTILEVERED PROBE FOR ELECTRONIC DEVICES";

U.S. patent application Ser. No. 08/641,667 entitled, "HIGH DENSITY TEST PROBE WITH RIGID SURFACE STRUCTURE";

U.S. patent application Ser. No. 08/527,733 entitled, "INTERCONNECTOR WITH CONTACT PADS HAVING ENHANCED DURABILITY";

U.S. patent application Ser. No. 08/752,469 entitled, "FOAMED ELASTOMERS FOR WAFER PROBING APPLICATIONS AND INTERPOSER CONNECTORS";

U.S. patent application Ser. No. 08/744,903 entitled, "INTEGRAL RIGID CHIP TEST PROBE";

U.S. patent application Ser. No. 08/756,831 entitled, "HIGH TEMPERATURE CHIP TEST PROBE";

U.S. patent application Ser. No. 08/756,830 entitled, "A HIGH DENSITY INTEGRAL TEST PROBE AND FABRICATION METHOD";

U.S. patent application Ser. No. 08/754,869 entitled, "HIGH DENSITY INTEGRATED CIRCUIT APPARATUS, TEST PROBE AND METHODS OF USE THEREOF".

It is to be understood that the above described embodiments are simply illustrative of the principles of the invention. Various other modifications and changes may be devices by those of skill in the art which will embody the principles of the invention and fall within the spirit and scope thereof.

What is claimed is:

1. An apparatus for making electrical contact with a plurality of bond pads on an integrated circuit device comprising:

a fan out substrate having a first surface;

said first surface having a plurality of contact locations;

a plurality of ball bonds attached to said plurality of contact locations;

said plurality of ball bonds and said plurality of contact locations being enclosed in a hollow area formed within a support frame composed of rigid material and compliant material;

a plurality of wires extending outward from said ball bonds, away from said first surface on said fan out substrate;

a plurality of ball shaped contacts on the ends of said plurality of wires and means for maintaining said plurality of balls in substantially fixed positions said plurality of ball shaped contacts extending above the upper surface of said means for maintaining said balls in substantially fixed positions.

2. An apparatus according to claim 1, wherein said high density probe is for simultaneously contacting a plurality of integrated circuit devices.

3. An apparatus according to claim 1, further including a preformed frame of foamed elastomer material surrounding clusters, groupings, or arrays of said probes.

4. An apparatus according to claim 3, further including a sheet of rigid material that has a thin coating of a polymer material and a plurality of openings corresponding to said plurality of ball shaped contacts.

5. An apparatus according to claim 3, further including a layer of elastomer material surrounding said probes in said cluster.

6. An apparatus according to claim 5, wherein said means for maintaining is a sheet of Invar material that has a thin coating of a polymer material and a plurality of openings corresponding to said plurality of ball shaped contacts, said means having an upper and a lower surface;

said thin coating of polymer material is segmented and bonded to said means for maintaining to eliminate TCE mismatch problems over large surface areas; said plurality of ball shaped contacts extending above the upper surface of said means for maintaining said balls in substantially fixed positions and adjacent to the openings in said thin polymer layer.

7. An apparatus according to claim 6, further including a thick frame of rigid material attached to said sheet of Invar material with said thin coating of a polymer material and said plurality of openings corresponding to said plurality of ball shaped contacts.

8. An apparatus according to claim 5, further including a sheet of rigid material with a plurality of large diameter openings corresponding to said plurality of ball shaped contacts.

9. An apparatus according to claim 8, further including a sheet of polymer material with a plurality of small diameter openings corresponding to said plurality of ball shaped contacts place on top of said sheet of Invar material.

10. An apparatus according to claim 8, further including a plurality of probes arrays corresponding to the location of a plurality of IC devices on a wafer.

11. An apparatus according to claim 5, further including a sheet of polymer material with a plurality of openings corresponding to said plurality of ball shaped contacts.

12. An apparatus according to claim 11, further including a frame of rigid material attached to said sheet of polymer material with said plurality of openings corresponding to said plurality of ball shaped contacts.

* * * * *